(12) United States Patent
Tsai et al.

(10) Patent No.: US 10,546,537 B2
(45) Date of Patent: Jan. 28, 2020

(54) DISPLAY DEVICE WITH DISPLAY DRIVERS ARRANGED ON EDGE THEREOF

(71) Applicant: InnoLux Corporation, Miao-Li County (TW)

(72) Inventors: Yi-Cheng Tsai, Miao-Li County (TW); Cheng-Tso Chen, Miao-Li County (TW); Hui-Min Huang, Miao-Li County (TW); Li-Wei Sung, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 162 days.

(21) Appl. No.: 15/785,477

(22) Filed: Oct. 17, 2017

(65) Prior Publication Data

US 2018/0122303 A1 May 3, 2018

Related U.S. Application Data

(60) Provisional application No. 62/449,605, filed on Jan. 24, 2017, provisional application No. 62/442,454, (Continued)

(30) Foreign Application Priority Data

Jul. 25, 2017 (CN) .......................... 2017 1 0611594

(51) Int. Cl.
*G09G 3/3266* (2016.01)
*G09G 3/3275* (2016.01)
(Continued)

(52) U.S. Cl.
CPC ....... *G09G 3/3266* (2013.01); *G02F 1/13452* (2013.01); *G09G 3/2092* (2013.01); *G09G 3/3275* (2013.01); *G09G 3/3674* (2013.01); *G09G 3/3685* (2013.01); *H05K 1/144* (2013.01); *H05K 1/189* (2013.01); *G09G 2300/0408* (2013.01); *G09G 2310/027* (2013.01); *G09G 2310/0267* (2013.01); *H01L 25/18* (2013.01); *H01L 27/3276* (2013.01);
(Continued)

(58) Field of Classification Search
CPC .. G09G 3/3266; G09G 3/3275; G09G 3/3674; G09G 3/3685; G09G 3/3688; G09G 2/2092; G09G 3/30
See application file for complete search history.

(56) References Cited

U.S. PATENT DOCUMENTS

| 4,468,659 A * | 8/1984 | Ohba ...................... G09G 3/30 345/206 |
| 2002/0017859 A1* | 2/2002 | Ishikawa ................... G09F 9/30 313/504 |

(Continued)

*Primary Examiner* — Jennifer Mehmood
*Assistant Examiner* — James S Nokham
(74) *Attorney, Agent, or Firm* — McClure, Qualey & Rodack, LLP (57) ABSTRACT

A display device includes a display panel and display drivers disposed on the display panel. The distance between a first display driver and a second display driver of the display drivers is greater than the distance between a second display driver and a third display driver of the display drivers. The display panel includes a curved segment adjacent to an area between the first display driver and the second display driver.

18 Claims, 9 Drawing Sheets

Related U.S. Application Data filed on Jan. 5, 2017, provisional application No. 62/416,679, filed on Nov. 2, 2016.

(51) Int. Cl.
*H01L 27/18* (2006.01)
*G09G 3/36* (2006.01)
*G09G 3/20* (2006.01)
*G02F 1/1345* (2006.01)
*H05K 1/18* (2006.01)
*H05K 1/14* (2006.01)
*H01L 27/32* (2006.01)
*H01L 25/18* (2006.01)

(52) U.S. Cl.
CPC .... *H01L 27/3288* (2013.01); *H05K 2201/041* (2013.01); *H05K 2201/09027* (2013.01); *H05K 2201/10128* (2013.01); *H05K 2201/10136* (2013.01); *H05K 2201/10356* (2013.01)

(56) References Cited

U.S. PATENT DOCUMENTS

| | | | |
|---|---|---|---|
| 2005/0225690 A1* | 10/2005 | Battersby | G02F 1/13336 349/41 |
| 2006/0217023 A1* | 9/2006 | Park | C23C 14/042 445/24 |
| 2009/0127236 A1* | 5/2009 | Hong | C23C 14/042 219/121.64 |
| 2010/0156945 A1* | 6/2010 | Yoshida | G02F 1/1345 345/690 |
| 2010/0195294 A1* | 8/2010 | Sakata | F16M 11/10 361/749 |
| 2011/0031486 A1* | 2/2011 | Shigemura | C23C 14/042 257/40 |
| 2016/0307534 A1* | 10/2016 | Wu | G09G 3/3688 |

* cited by examiner

DISPLAY DEVICE WITH DISPLAY DRIVERS ARRANGED ON EDGE THEREOF

CROSS-REFERENCE TO RELATED APPLICATIONS

This application claims the benefit of U.S. Provisional Application No. 62/416,679, filed on Nov. 2, 2016, No. 62/442,454, filed on Jan. 5, 2017, and No. 62/449,605, filed on Jan. 24, 2017, the entirety of which are incorporated by reference herein.

This Application claims priority of China Patent Application No. 201710611594.3 filed on Jul. 25, 2017, the entirety of which is incorporated by reference herein.

BACKGROUND OF THE INVENTION

Field of the Invention

The present disclosure relates to a display device, and in particular to a display device with display drivers.

Description of the Related Art

Conventional liquid-crystal display devices are widely utilized in various kinds of displays. However, display panels of various shapes and degrees of curvature have been developed recently for application in different purposes.

However, the edges or the surface of the display panel may include curved segments, which can raise the cost of manufacturing the liquid-crystal display devices, as well as decreasing the yield of liquid-crystal display devices.

Although existing liquid-crystal display devices have been generally adequate for their intended purposes, they have not been entirely satisfactory in all respects. Consequently, it would be desirable to provide a solution for improving liquid-crystal display devices.

BRIEF SUMMARY OF THE INVENTION

The disclosure provides a display device including a display panel and display drivers. The display panel includes a display surface, and the display surface includes a first edge area and a second edge area opposite to the first edge area. The display driver is disposed on the first edge area, and electrically connected to the display panel. A first display driver of the display driver is adjacent to a second display driver of the display driver, and a third display driver of the display drivers is adjacent to the second display driver.

The first edge area has a first segment adjacent to the area between the first display driver and the second display driver, and the first segment is a curved segment. The distance between the first display driver and the second display driver is longer than the distance between the second display driver and the third display driver.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. The shape, size, and thickness depicted in the drawings may not be drawn to scale or may be simplified for clarity of discussion; these drawings are merely intended for illustration.

Figure 1:
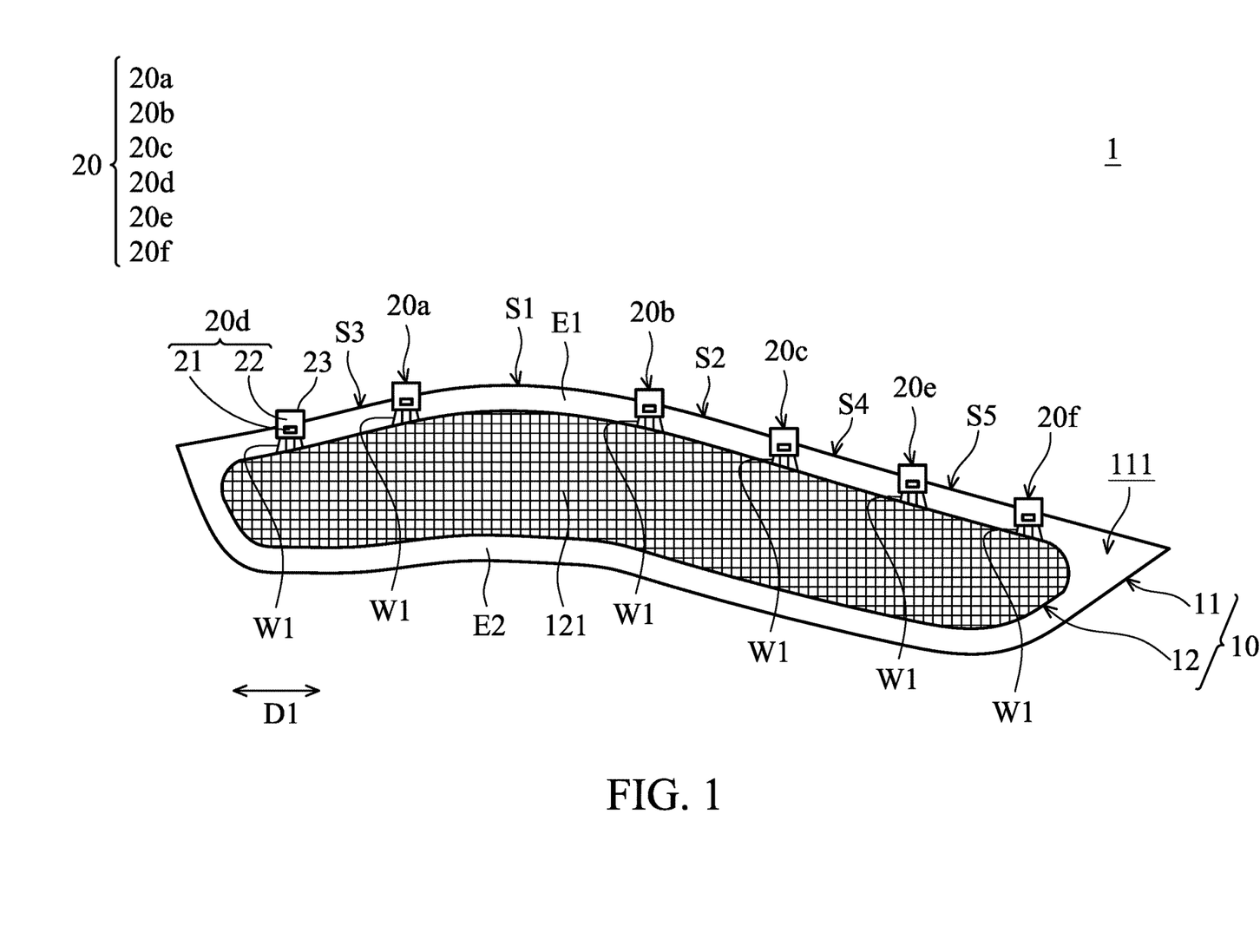
FIG. 1 is a top view of a display device in accordance with a first embodiment of the disclosure.

FIG. 1 is a top view of a display device 1 in accordance with a first embodiment of the disclosure. The display device 1 includes a display panel 10 and display drivers 20. The display panel 10 is configured to display an image. The display panel 10 may be a liquid-crystal display panel (LCD panel) or an organic light-emitting-diode panel (OLED panel), but it is not limited thereto. The display panel 10 may an irregular shape, a circular shape, an elliptical shape, or a polygon, but it is not limited thereto. In this embodiment, the display panel 10 is an irregular shape. The display panel 10 may be used in vehicles, such as in a vehicle dashboard.

In this embodiment, the display panel 10 includes a substrate 11 and a display layer 12. The substrate 11 may be transparent. In some embodiments, the substrate 11 may be a glass substrate or a plastic substrate, but it is not limited thereto. The display layer 12 is configured to display an image. The display layer 12 is disposed on the substrate 11. In this embodiment, the display layer 12 covers the central area of the display surface 111 of the substrate 11, and does not cover or completely cover the edge of the display surface 111. The display layer 12 may include pixels 121. The pixels 121 are arranged in an array.

The display drivers 20 are disposed on the edge of the display surface 111. The display drivers 20 are electrically connected to the display panel 10. In this embodiment, the display drivers 20 further include wires W1 connected to each of the pixels 121 of the display layer 12. The display drivers 20 are configured to transmit display signals to the pixels 121.

Each display driver 20 includes a flexible circuit board 21 and a driving chip 22. In some embodiments, the display drivers 20 may be a chip-on-film (COF) package. The driving chip 22 is disposed on the flexible circuit board 21. The flexible circuit board 21 is connected to the display panel 10 and configured to transmit the display signals to the pixel 121. In some embodiments, the wires W1 are pins of a COF package. In some embodiments, the display driver 20 may be a chip-on-glass (COG) package. The driving chip 22 is directly disposed on the edge of the display panel 10 and electrically connected to the flexible circuit board 21 and the display layer 12.

In this embodiment, the display surface 111 has a first edge area E1 and a second edge area E2 opposite to the first edge area E1. The first edge area E1 and the second edge area E2 are two opposite edge areas of the display surface 111, and the display layer 12 is located between the first edge area E1 and the second edge area E2. The display driver 20 may be disposed on or bonded to the first edge area E1 and/or the second edge area E2. In this embodiment, the display driver 20 may be disposed on the first edge area E1. Moreover, the display driver 20 may not be disposed on the second edge area E2 since the space of the second edge area E2 is too small, and the display driver 20 cannot be disposed on the second edge area E2.

In this embodiment, there are six display drivers 20. However, according to the number of pixels 121, there are three, four, or seven, or at least seven display drivers 20, but it is not limited thereto.

As shown in FIG. 1, the display drivers 20d, 20a, 20b, 20c, 20e and 20f are arranged on the first edge area E1 in sequence. In other words, display driver 20a is adjacent to display driver 20b and display driver 20d. Display driver 20b is adjacent to display driver 20c. Display driver 20e is adjacent to display driver 20c and display driver 20f.

In some embodiments, the display drivers 20 are arranged at the same distance. However, as shown in FIG. 1, the edges of the display panel 10 have many curved segments. If the display driver 20 is disposed on a segment with a greater degree of curvature, it may be hard to affix the display driver 20 to the curved segment, or it may peel off of the substrate 11 during the manufacturing process of the display device 1. Therefore, in this embodiment, the positions of the display drivers 20 disposed on the display panel 10 may be adjusted so as to keep away from the curved segments of the display panel 10, or to be disposed on the curved segments with a smaller degree of curvature.

In this embodiment, the first edge area E1 has a segment S1 located between the display driver 20a and the display driver 20b. The segment S1 is a curved segment. The first edge area E1 has a segment S2, located between the display driver 20b and the display driver 20c. The curvature of the segment S1 is greater than the curvature of the segment S2. In some embodiments, the segment S2 may be a linear segment.

The first edge area E1 further has a segment S3 located between the display driver 20a and the display driver 20d. The curvature of the segment S1 is greater than the curvature of the segment S3. In some embodiments, the segment S3 may be a linear segment.

Accordingly, as shown in FIG. 1, by adjusting the position of display driver 20a toward display driver 20d, and adjusting the position of display driver 20b toward display driver 20c, the positions of display driver 20a and display driver 20b are far from the segment S1. Therefore, display driver 20a and display driver 20b can be disposed on the segment with the smaller degree of curvature in the first edge area E1.

In this embodiment, the distance between display driver 20a and display driver 20b is greater than the distance between display driver 20b and display driver 20c. The distance between display driver 20a and display driver 20b is greater than the distance between display driver 20a and display driver 20d. In this embodiment, the described distance is defined as the distance between two adjacent edges of two adjacent display drivers 20.

Moreover, the first edge area E1 further has a segment S4 that is adjacent to the area between display driver 20c and display driver 20e. The first edge area E1 further has a segment S5 that is adjacent to the area between display driver 20e and display driver 20f. Since segment S4 and segment S5 may be linear segments, the positions of display driver 20c, display driver 20e, and display driver 20f do not need to be adjusted.

In some embodiments, the curvature of segment S1 is greater than the curvatures of segment S4 and segment S5. The curvatures of segment S2 and/or segment S3 are greater than or equal to the curvatures of segment S4 and/or segment S5.

In this embodiment, the distance between display driver 20c and display driver 20e is equal to or greater than the distance between display driver 20e and display driver 20f. Moreover, the distance between display driver 20a and display driver 20b is greater than the distance between display driver 20c and display driver 20e. The distance between display driver 20b and display driver 20c is greater than the distance between display driver 20c and display driver 20e.

In this embodiment, since the curvature of segment S1 is greater than the curvatures of segment S2, segment S3, segment S4, and/or segment S5, the number of wires W1 of display driver 20a or display driver 20b is less than the number of wires W1 of display driver 20c, display driver 20d, display driver 20e or display driver 20f. Since there are fewer wires W1 of display driver 20a and/or display driver 20b, there are also fewer wires W1 disposed on the segments of the display panel 10 with the greater degree of curvature. Therefore, poor display signals caused by the wires W1 disposed on the segments with greater curvature is reduced.

In this embodiment, the display drivers 20 are data drivers and scanner drivers. The data drivers and the scanner drivers are alternately arranged in the first edge area E1. For example, display driver 20d, display driver 20b, and display driver 20e are data drivers. Display driver 20a, display driver 20c, and display driver 20f are scanner drivers.

In some embodiments, display driver 20d, display driver 20b, and display driver 20e are scanner drivers. Display driver 20a, display driver 20c, and display driver 20f are data drivers.

In some embodiments, there are at least two scanner drivers between two adjacent data drivers. For example, display driver 20d, display driver 20c, and display driver 20e are data drivers. Display driver 20a, display driver 20b, and display driver 20f are scanner drivers.

In some embodiments, there are at least two data drivers located between two adjacent scanner drivers. For example, display driver 20d, display driver 20c, and display driver 20e may be scanner drivers. Display driver 20a, display driver 20b, and display driver 20f may be data drivers.

Figure 2:
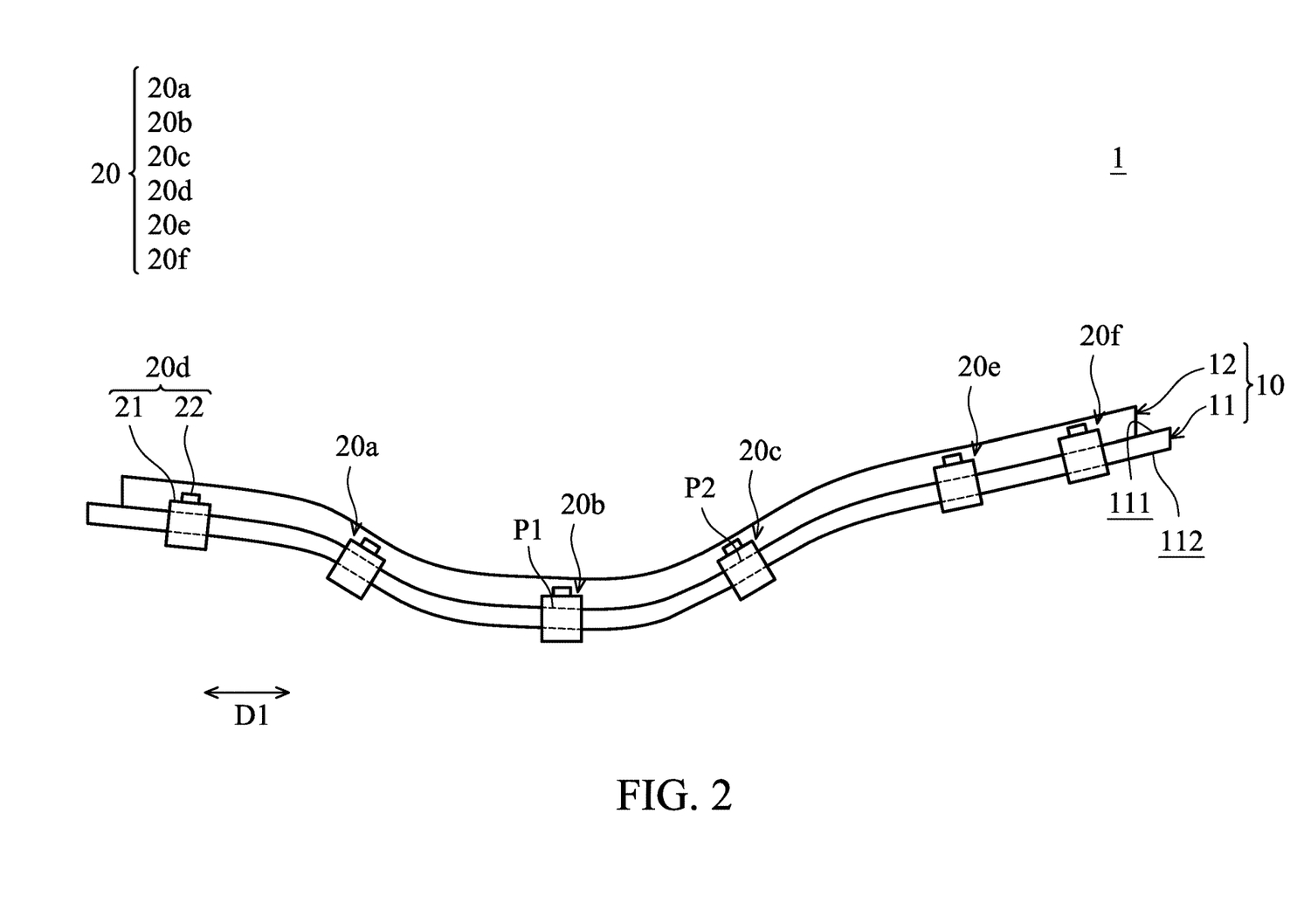
FIG. 2 is a side view of the display device in accordance with a second embodiment of the disclosure.

FIG. 2 is a side view of the display device 1 in accordance with a second embodiment of the disclosure. One end of the flexible circuit board 21 is affixed to the display surface 111 of the substrate 11. The flexible circuit board 21 can be bent to allow the other end of the flexible circuit board 21 to be disposed on the rear surface 112 of the substrate 11. In other words, the substrate 11 is located between the two ends of the flexible circuit board 21.

In this embodiment, the display panel 10 is a curved display panel. To ensure that the display drivers 20 are stably affixed to the display panel 10, the display drivers 20 can be disposed on the flat segments of the display panel 10.

As shown in FIG. 2, display driver 20a, display driver 20b, display driver 20c, display driver 20d, display driver 20e, and display driver 20f are disposed on different flat or substantially flat segments of the display surface 111 of the display panel 10. In this embodiment, display driver 20b is substantially disposed on the vertex point P1 of the display surface 111. Display driver 20c is substantially located at the inflection point P2 of the display surface 111.

Figure 3:
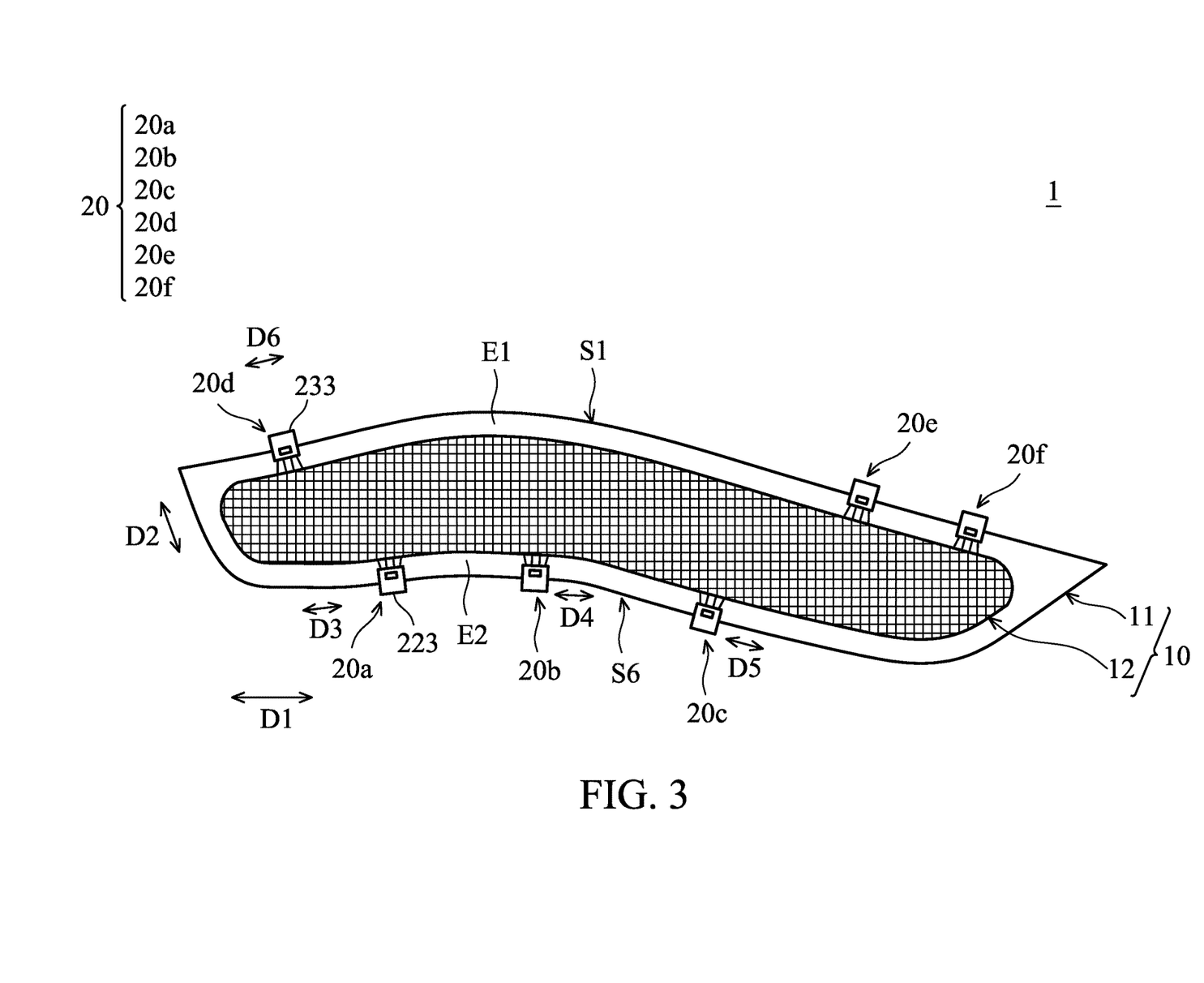
FIG. 3 is a top view of a display device in accordance with a third embodiment of the disclosure.

FIG. 3 is a top view of a display device 1 in accordance with a third embodiment of the disclosure. The display driver 20 is disposed on the first edge area E1 and the second edge area E2. The number of display drivers 20 arranged on the first edge area E1 is equal to or different from the number of display drivers 20 arranged on the second edge area E2.

In some embodiments, the arrangement of the display drivers 20 on the first edge area E1 and the arrangement of the display drivers 20 on the second edge area E2 can be varied according to different designs.

As shown in FIG. 3, for example, display driver 20d, display driver 20e, and display driver 20f are arranged on the first edge area E1. Display driver 20a, display driver 20b, and display driver 20c are arranged on the second edge area E2.

In the arrangement direction D2 perpendicular to the arrangement direction D1, the display drivers 20 can be selectively disposed in the first edge area E1 or the second edge area E2. For example, the display driver 20b can be arranged in the first edge area E1 or the second edge area E2 in the arrangement direction D2. In this embodiment, if in the arrangement direction D2, the curvature of the segment S1 of the first edge area E1 is greater than the curvature of the segment S2 of the second edge area E2, the second edge area E2 may be chosen as the place where the display driver 20b is to be disposed.

In this embodiment, the pixels 121 in the same row are arranged along the arrangement direction D1. The acute angles between the side edges 23 of the display drivers 20 and the arrangement direction D1 may be varied. As shown in FIG. 3, the side edge 23 of the display driver 20a is extended along the first direction D3, and there is an acute angle between the first direction D3 and the arrangement direction D1. The side edge 23 of the display driver 20b is extended along the second direction D4, and there is an acute angle between the second direction D4 and the arrangement direction D1.

Moreover, the side edge 23 of the display driver 20c is extended along the third direction D5, and there is an acute angle between the third direction D5 and the arrangement direction D1. The side edge 23 of the display driver 20d is extended along the fourth direction D6, and there is an acute angle between the fourth direction D6 and the arrangement direction D1. The described acute angles may be the same or different. The acute angles are in a range from about 1 degree to 89 degrees. The display drivers 20 can be stably disposed on the display panel 10 according to the orientations of the display drivers 20 arranged on the display panel 10.

In some embodiments, the side edge of the location of the display panel 10 on which the display driver 20 is disposed is parallel or substantially parallel to the side edge 23 of the display driver 20. The display drivers 20 can be stably disposed on the display panel 10 due to the orientations of the display drivers 20 arranged on the display panel 10.

In some embodiments, display driver 20d, display driver 20e, and display driver 20f are data drivers. Display driver 20a, display driver 20b, and display driver 20c are scanner drivers.

In some embodiments, display driver 20d, display driver 20e, and display driver 20f are scanner drivers. Display driver 20a, display driver 20b, and display driver 20c are data drivers. The layout of the display panel 10 can be simplified by the arrangements of the scanner driver and the data driver arranged on both the first edge area E1 and the second edge area E2.

Figure 4:
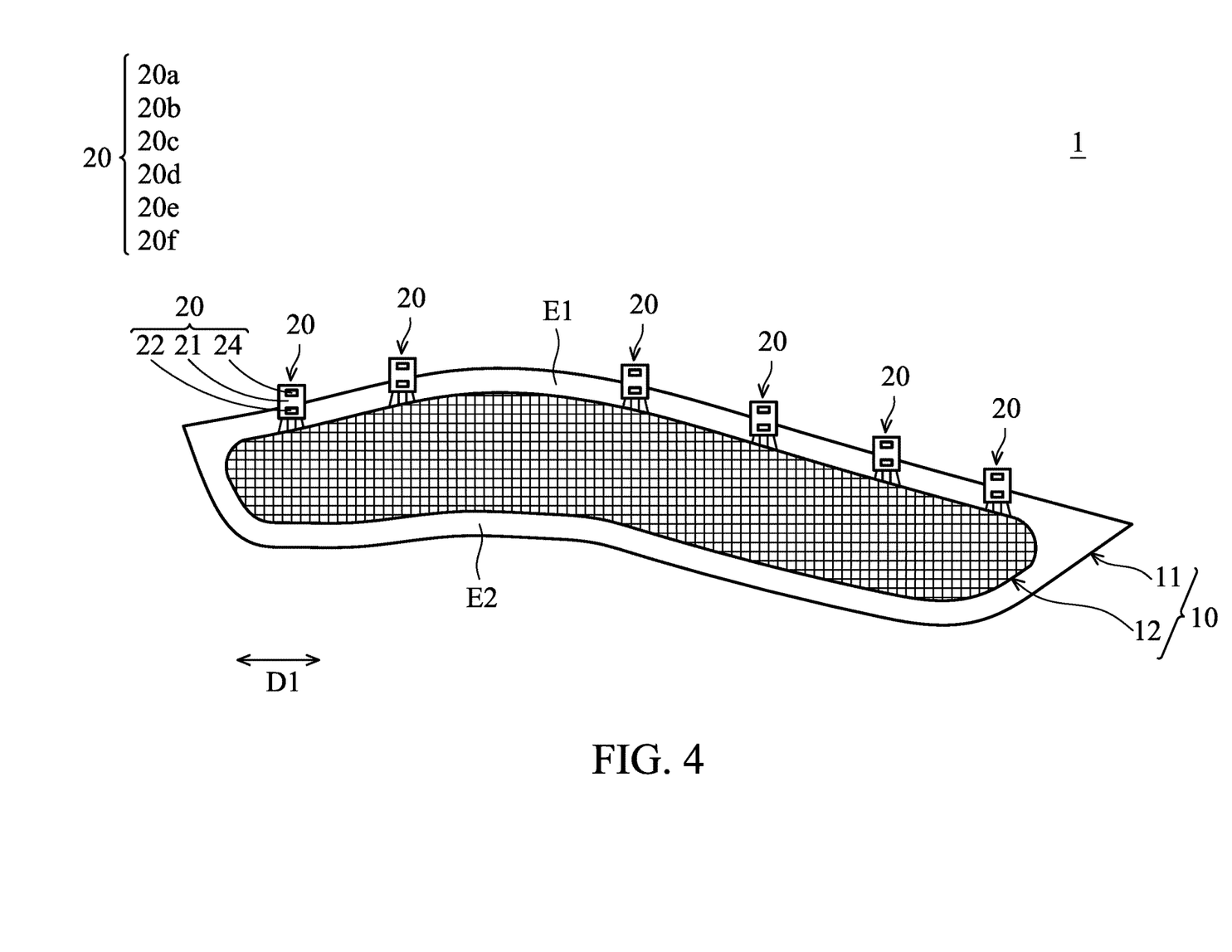
FIG. 4 is a top view of a display device in accordance with a fourth embodiment of the disclosure.

FIG. 4 is a top view of a display device 1 in accordance with a fourth embodiment of the disclosure. As shown in FIG. 4, the display drivers 20 include driving chip 22 and driving chip 24. Driving chip 22 and driving chip 24 are disposed on the same flexible circuit board 21. Driving chip 22 may be a data chip, and driving chip 24 may be a scanner chip. In some embodiments, driving chip 22 may be a scanner chip, and driving chip 24 may be a data chip.

In this embodiment, the flexible circuit board 21 can be bent, and one end of the flexible circuit board 21 can be disposed on the rear surface 112 of the display panel 10. Therefore, driving chip 22 and driving chip 24 are located at two opposite sides of the display panel 10.

Figure 5:
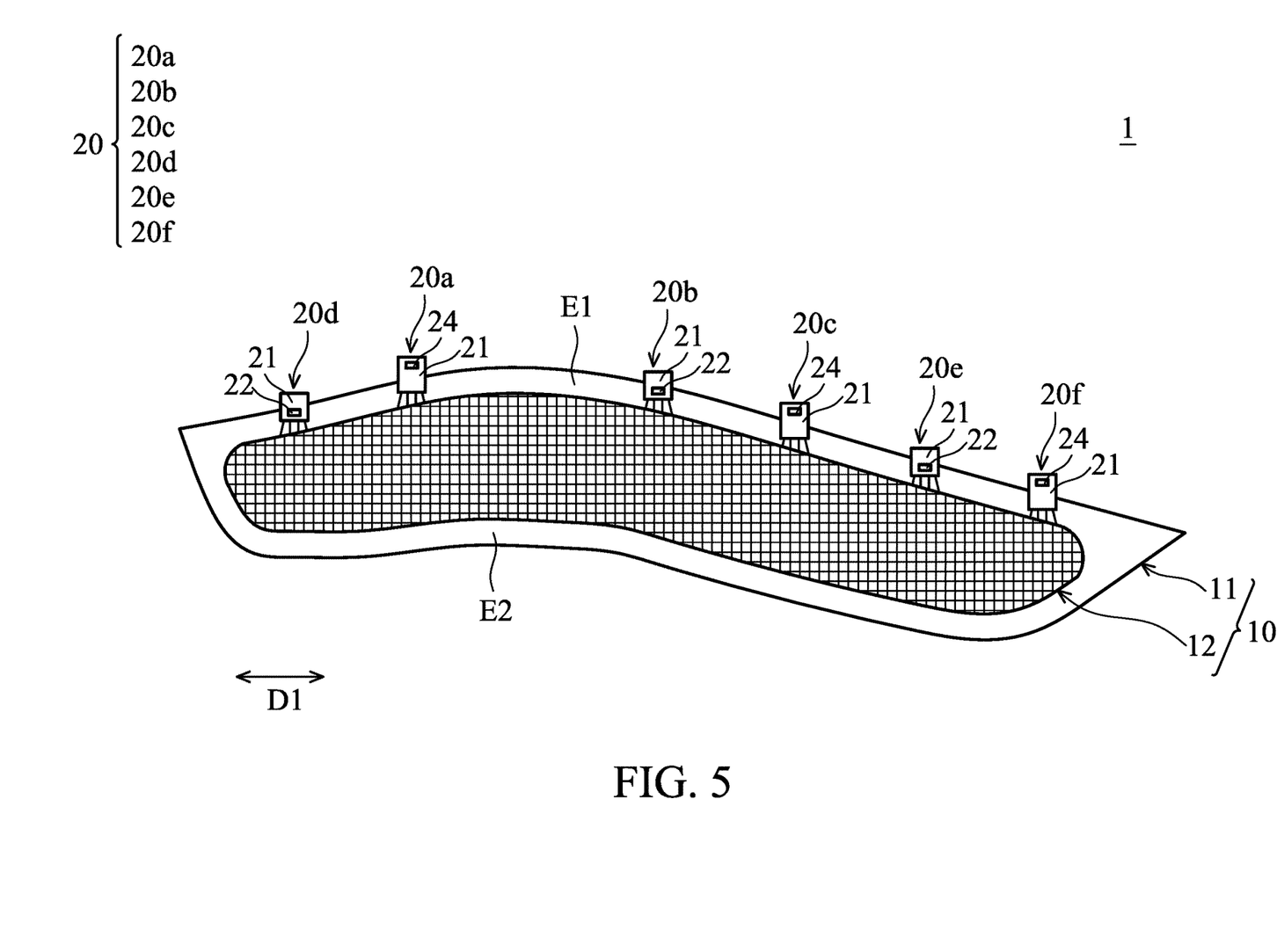
FIG. 5 is a top view of a display device in accordance with a fifth embodiment of the disclosure.

FIG. 5 is a top view of a display device 1 in accordance with a fifth embodiment of the disclosure. As shown in FIG. 5, each display driver 20 includes a driving chip 22 or a driving chip 24. The driving chips 22 and the driving chips 24 are disposed on different flexible circuit boards 21. The driving chips 22 are disposed on the ends of the flexible circuit boards 21 connected to the display panel 10. The driving chips 24 are disposed on the other ends of the flexible circuit boards 21.

In some embodiments, the flexible circuit board 21 is bent, and one end of the flexible circuit board 21 is connected to the rear surface 112 of the display panel 10. Therefore, the driving chips 24 can be located on the rear surface 112 of the display panel 10.

The driving chips 22 may be data chips, and the driving chips 24 may be scanner chips. Therefore, in this embodiment, display driver 20b, display driver 20d, and display driver 20e may be data drivers. Display driver 20a, display driver 20c, and display driver 20f may be scanner drivers.

In some embodiments, the driving chips 22 may be scanner chips, and the driving chip 24 may be data chips. Display driver 20b, display driver 20d, and display driver 20e may be scanner drivers. Display driver 20a, display driver 20c, and display driver 20f may be data drivers.

In FIG. 5, the data drivers and the scanner drivers are alternately arranged along the first edge area E1, but it is not limited thereto. The arrangement of the data driver and the scanner drivers can be varied to suit different designs.

Figure 6:
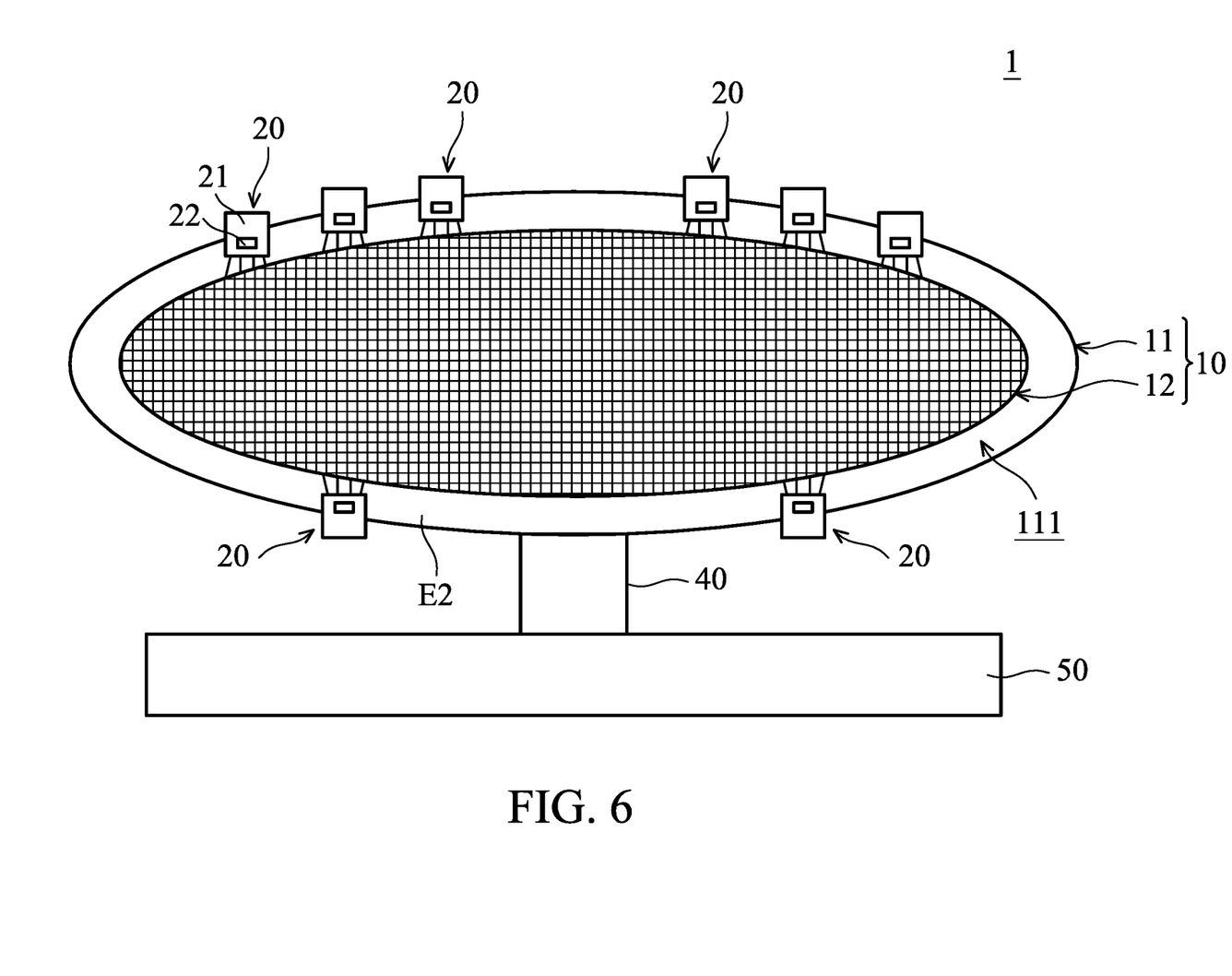
FIG. 6 is a top view of a display device in accordance with a sixth embodiment of the disclosure.
Figure 7:
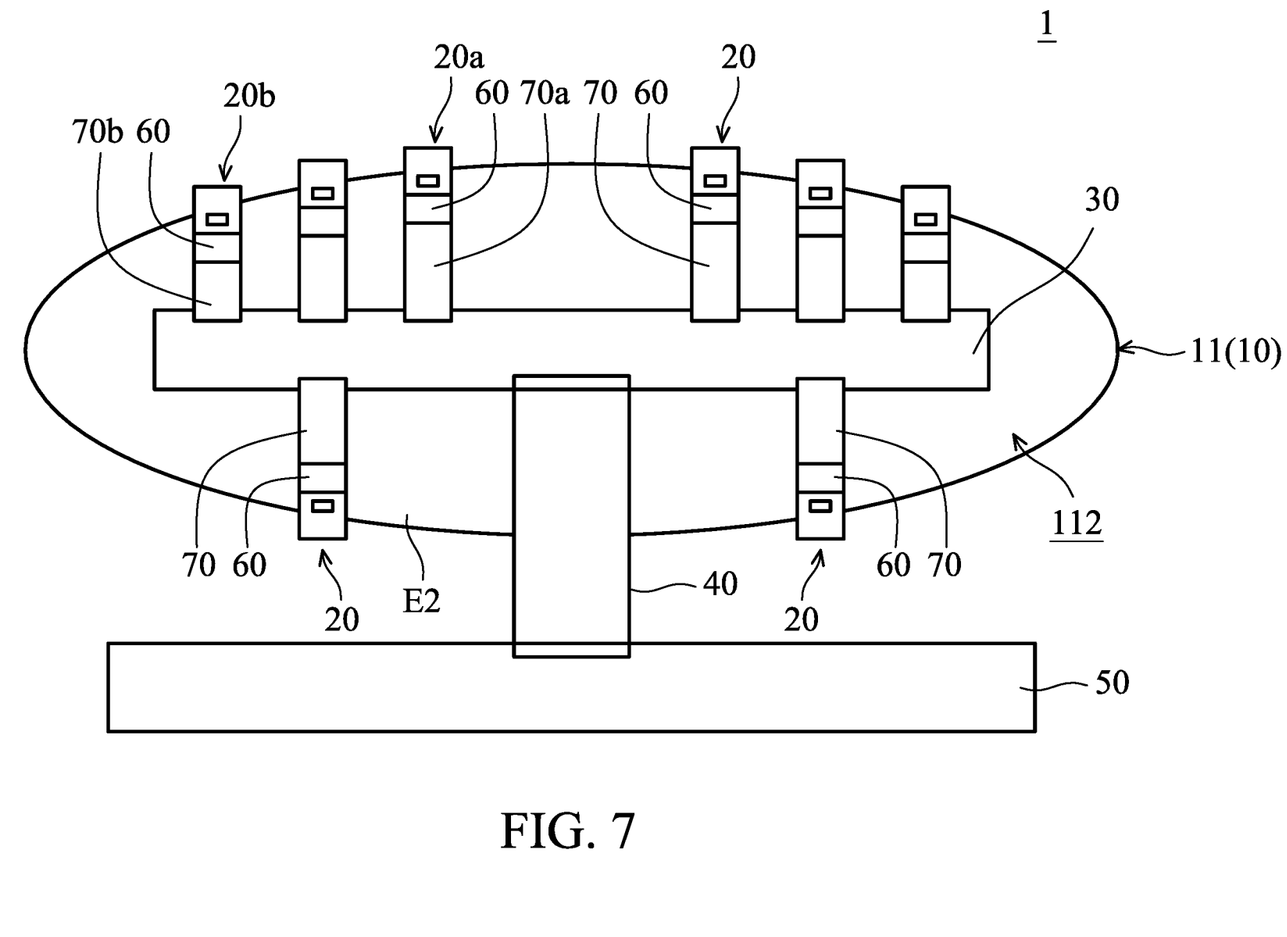
FIG. 7 is a bottom view of the display device in accordance with the sixth embodiment of the disclosure.

FIG. 6 is a top view of a display device 1 in accordance with a sixth embodiment of the disclosure. FIG. 7 is a bottom view of the display device 1 in accordance with the sixth embodiment of the disclosure. In this embodiment, the display panel 10 is an ellipse. The display device 1 further includes a system circuit board 30, a transmission line 40 and a light source 50. The system circuit board 30 is disposed on the rear surface 112 of the display panel 10. The system circuit board 30 is parallel to or substantially parallel to the display panel 10. In some embodiments, the system circuit board 30 is a flexible circuit board. The transmission line 40 is connected to the system circuit board 30 and the light source 50. The light source 50 is configured to emit light to the display panel 10.

The display device 1 further includes adapters 60 and cables 70. The adapters 60 are disposed on the rear surface 112 of the display panel 10, and connected to the flexible circuit board 21 and the cables 70. The cables 70 are disposed on the rear surface 112 of the display panel 10, and connected to the system circuit board 30.

As shown in FIG. 7, due to the shape of the display panel 10, at least two lengths of the cables 70 are different. In some embodiments, the cables 70 have two or at least three different lengths. For example, the cable 70a of the display driver 20a is longer than the cable 70b of the display driver 20b. In some embodiments, the length of the cable 70 is defined as the length from one end of the cable 70 which is connected to the adapter 60 to the other end of the cable 70 which is connected to the system circuit board 30.

In this embodiment, the display drivers 20 are connected to the system circuit board 30 via the cables 70 with different lengths. Therefore, the sizes of the display drivers 20 and the flexible circuit boards 21 can be the same, and thus the manufacturing cost of the display device 1 can be reduced. In some embodiments, the flexible circuit boards 21 have the same area. In some embodiments, the difference in the areas of the flexible circuit boards 21 is less than 5%.

Figure 8:
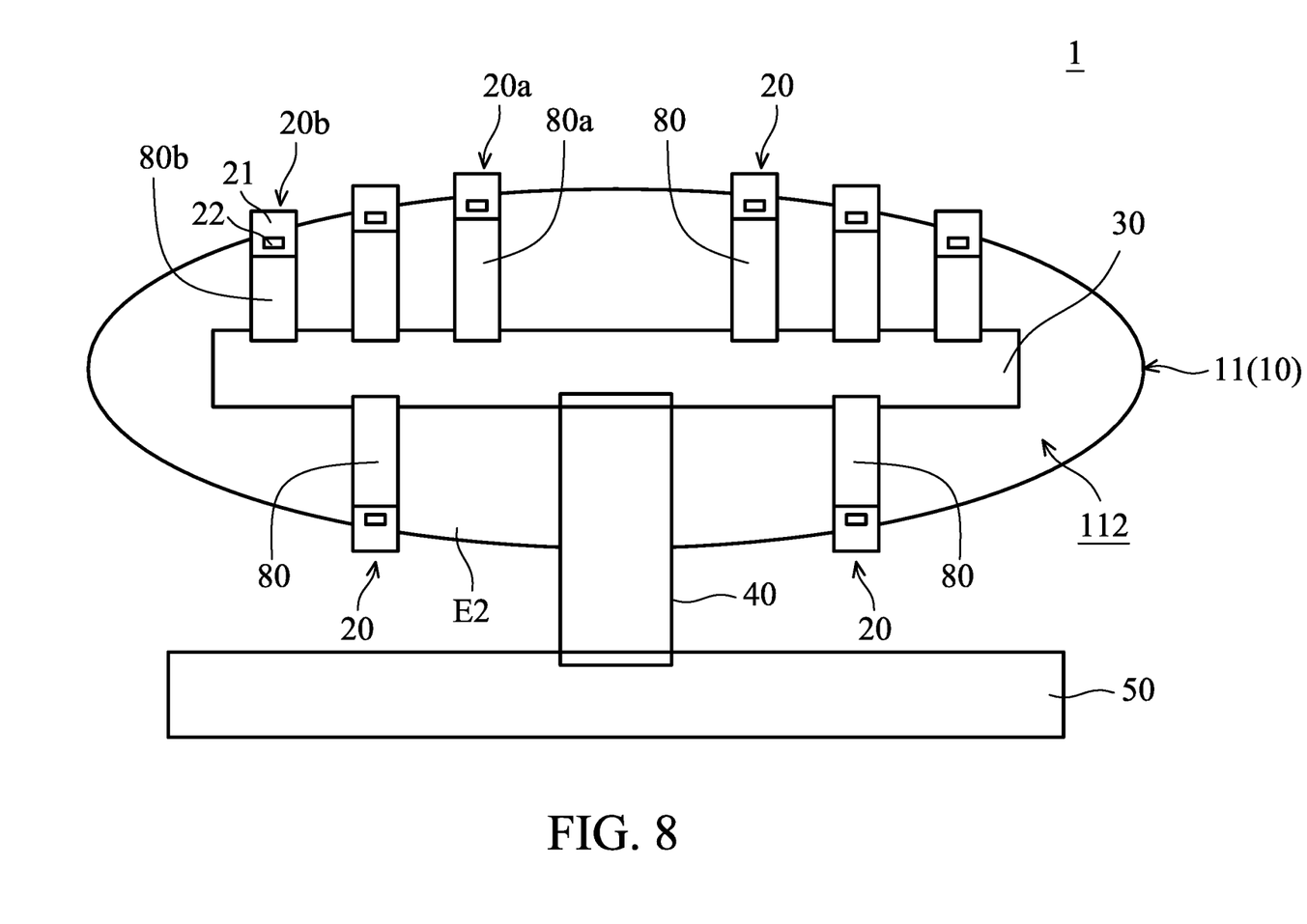
FIG. 8 is a top view of a display device in accordance with a seventh embodiment of the disclosure.

FIG. 8 is a top view of a display device 1 in accordance with a seventh embodiment of the disclosure. The display device 1 further includes connection circuit boards 80. The connection circuit boards 80 are disposed on the rear surface 112 of the display panel 10, and are connected to the flexible circuit board 21 and the system circuit board 30. In some embodiments, the connection circuit boards 80 may be flexible circuit boards.

As shown in FIG. 8, due to the shape of the display panel 10, at least two of the connection circuit boards 80 are of different lengths. In some embodiments, the connection circuit boards 80 have two or at least three different lengths. For example, the length of the connection circuit board 80a connected to display driver 20a is shorter than the length of the connection circuit board 80 connected to display driver 20b. In some embodiments, the length of the connection circuit board 80 is defined as the length from one end of the connection circuit board 80 which is connected to the flexible circuit board 21 to the other end of the connection circuit board 80 which is connected to the system circuit board 30.

In this embodiment, the display drivers 20 are connected to the system circuit board 30 via the connection circuit boards 80 with different lengths. Therefore, the sizes of the display drivers 20 or the flexible circuit boards 21 can be the same, and thus the manufacturing cost of the display device 1 can be reduced. In some embodiments, the flexible circuit boards 21 have the same area. In some embodiments, the difference in the area of the flexible circuit boards 21 is less than 5%.

Figure 9:
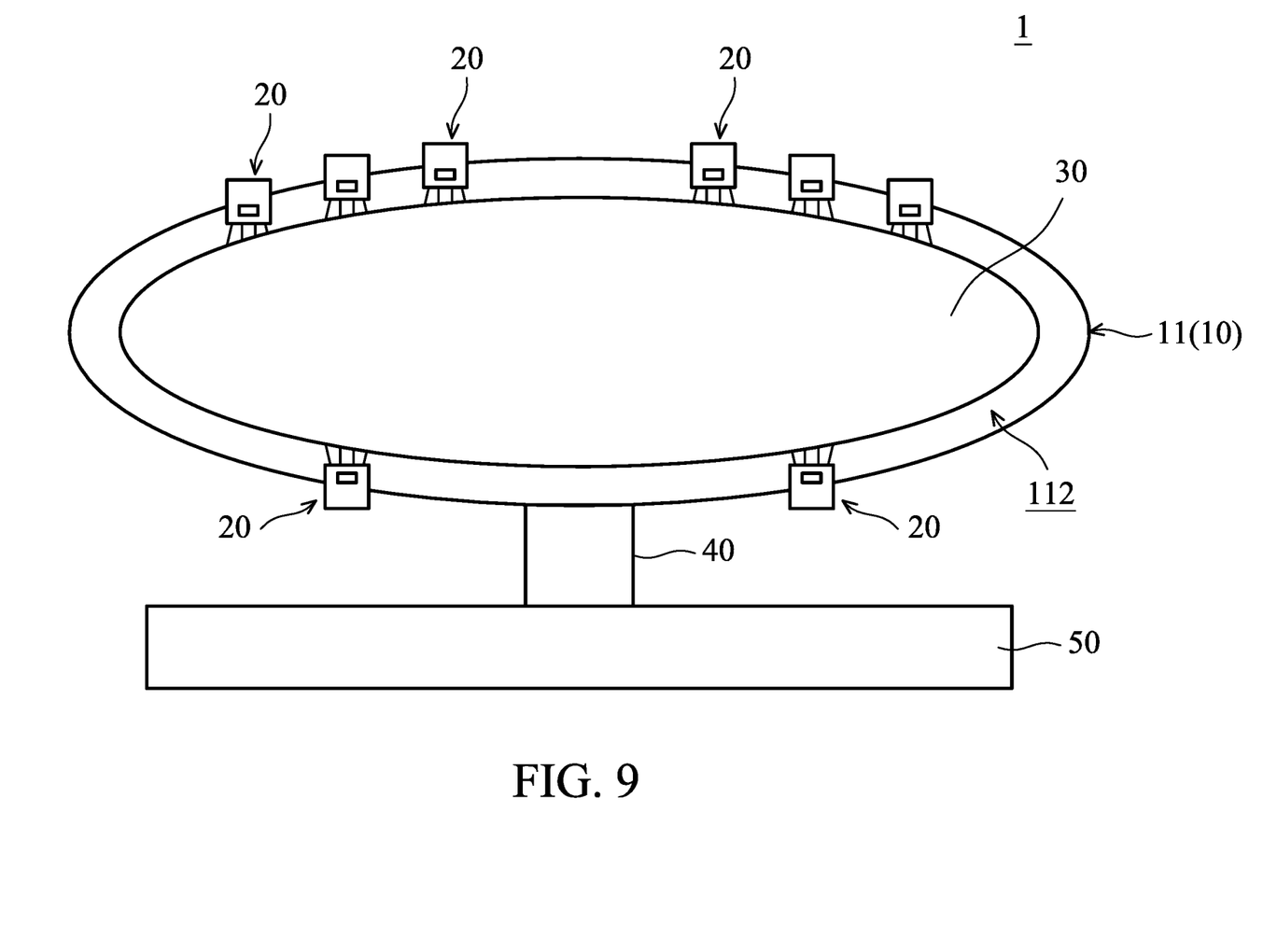
FIG. 9 is a top view of a display device in accordance with an eighth embodiment of the disclosure.

FIG. 9 is a top view of a display device 1 in accordance with an eighth embodiment of the disclosure. The system circuit board 30 is connected to the flexible circuit boards 21. In some embodiments, the system circuit board 30 is a flexible circuit board. The shape of the system circuit board 30 corresponds to the shape of the display panel 10. Therefore, the sizes of display drivers 20 or the flexible circuit boards 21 can be the same, and thus the manufacturing cost of the display device 1 can be reduced. In some embodiments, the flexible circuit boards 21 have the same length. The length of the flexible circuit board 21 is defined as the length from one end of the flexible circuit board 21 which is connected to the display surface 111 of the display panel 10 (as shown in FIG. 6) to the other end of the flexible circuit board 21 which is connected to the system circuit board 30.

In this embodiment, the shape of the system circuit board 30 and that of the display panel 10 are elliptical. The size of the system circuit board 30 is smaller than the size of the display panel 10.

In conclusion, according to the various arrangements of the display drivers of the disclosure, the display drivers can be stably disposed on various shapes of display panels, and the yield of the display device is improved. Moreover, in the disclosure, the sizes of the circuit boards of the display drivers disposed on various shapes of display panels can be the same, and thus the manufacturing cost of the display device 1 can be reduced.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a display panel comprising a display surface, wherein the display surface comprises a first edge area and a second edge area opposite to the first edge area;
   a plurality of display drivers disposed on the first edge area, and electrically connected to the display panel, wherein a first display driver of the display drivers is adjacent to a second display driver of the display drivers, and a third display driver of the display drivers adjacent to the second display driver, wherein each of the display drivers comprises a flexible circuit board and a driving chip disposed on the flexible circuit board;
   a plurality of adapters connected to the flexible circuit boards;
   a plurality of cables connected to the adapters; and
   a system circuit board connected to the cables,
   wherein the flexible circuit boards have the same area, and at least two of the cables have different lengths,
   wherein a distance between the first display driver and the second display driver is greater than a distance between the second display driver and the third display driver.

2. The display device as claimed in claim 1, wherein the first edge area has a first segment and a second segment, the first segment is located between the first display driver and the second display driver, and the first segment comprises a curved segment, wherein the second segment is located between the second display driver and the third display driver, and curvature of the first segment is greater than curvature of the second segment.

3. The display device as claimed in claim 2, wherein the second segment is a linear segment.

4. The display device as claimed in claim 1, wherein the first display driver or the second display driver is disposed on a flat segment of the display surface.

5. The display device as claimed in claim 1, wherein the display drivers are disposed on the first edge area and the second edge area.

6. The display device as claimed in claim 5, wherein the display drivers disposed on the first edge area are data drivers and the display drivers disposed on the second edge area are scanner drivers, or the display drivers disposed on the first edge area are scanner drivers and the display drivers disposed on the second edge area are data drivers.

7. The display device as claimed in claim 1, wherein the first display driver includes a plurality of first wires, the first wires are electrically connected to the display panel, the second display driver includes a plurality of second wires, and the second wires are electrically connected to the display panel, wherein the third display driver comprises a plurality of third wires, and the third wires are electrically connected to the display panel,
wherein a quantity of second wires is greater than a quantity of first wires or a quantity of third wires.

8. The display device as claimed in claim 1, wherein the display layers further comprises a plurality of data drivers and a plurality of scanner drivers, wherein the data drivers and the scanner drivers are alternately arranged in the first edge area.

9. The display device as claimed in claim 8, wherein there are at least two scanner drivers located between two adjacent data drivers of the data drivers, or there are at least two data drivers located between two adjacent scanner drivers of the scanner drivers.

10. The display device as claimed in claim 1, wherein the display panel comprises a plurality of pixels arranged in a direction, and an acute angles is between a side edge of one of the display drivers and the direction.

11. The display device as claimed in claim 1, wherein each of the display drivers further comprises:
a flexible circuit board electrically connected to the display panel, wherein one end of the flexible circuit board is disposed on the first edge area;
a data chip disposed on the flexible circuit board; and
a scanner chip disposed on the flexible circuit board.

12. The display device as claimed in claim 1, further comprising:
a display layer disposed on the display surface;
a system circuit board disposed on a rear surface of the display panel opposite to the display surface,
wherein one end of the flexible circuit board is connected to the display layer, and the other end of the flexible circuit board is connected to the system circuit board.

13. The display device as claimed in claim 1, further comprising:
a plurality of connection circuit boards respectively connected to the flexible circuit boards; and
a system circuit board connected to the connection circuit boards,
wherein the flexible circuit boards have the same area, and the at least two of the connection circuit boards have different lengths.

14. The display device as claimed in claim 1, further comprising a system circuit board connected to the flexible circuit boards, wherein a shape of the system circuit board corresponds to a shape of the display panel, and the flexible circuit boards have the same length.

15. The display device as claimed in claim 14, wherein the system circuit board and the display panel are elliptical shapes, and a size of the system circuit board is smaller than a size of the display panel.

16. The display device as claimed in claim 1, wherein the display panel comprises a substrate comprising the display surface and a display layer covering a central area of the display surface of the substrate, wherein the display layer is located between the first edge area and the second edge area.

17. The display device as claimed in claim 1, wherein the display panel is an irregular shape, a circular shape, or an elliptical shape.

18. The display device as claimed in claim 1, wherein the display drivers are chip-on-film packages or chip-on-glass packages.

* * * * *